United States Patent
Kumar et al.

(10) Patent No.: US 6,687,648 B1
(45) Date of Patent: Feb. 3, 2004

(54) METHOD OF PREDICTING RELIABILTY OF OXIDE-NITRIDE-OXIDE BASED NON-VOLATILE MEMORY

(75) Inventors: Santosh Kumar, San Jose, CA (US); Edmund L. Russell, Danville, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 173 days.

(21) Appl. No.: 10/033,556

(22) Filed: Nov. 2, 2001

(51) Int. Cl.$^7$ ............................................. G06F 11/26
(52) U.S. Cl. ........................................ 702/181; 710/58
(58) Field of Search ................................ 702/181, 179, 702/22, 30, 65, 79, 80, 81; 438/5, 10, 14, 17, 106; 324/532, 535, 537; 710/22, 23, 25, 58

(56) References Cited

U.S. PATENT DOCUMENTS 6,141,280 A * 10/2000 Cho ........................... 365/222
6,157,055 A * 12/2000 Yamaguchi et al. ........ 257/301
6,215,702 B1 * 4/2001 Derhacobian et al. . 365/185.29

* cited by examiner

Primary Examiner—Marc S. Hoff
Assistant Examiner—Edward Raymond
(74) Attorney, Agent, or Firm—Wagner, Murabito & Hao LLP

(57) ABSTRACT

A method and computer aided system for predicting the reliability of oxide-nitride-oxide (ONO) based non-volatile memory. ONO memory devices may be programmed. Margin voltages may be recorded initially, and during baking at 100 degrees C. and 300 degrees C. From this data, constants and activation energy may be determined through a first formula. Frenkel-Poole activation energy may be determined. Through the use of a second formula, decay time of the information stored in the ONO memory may be predicted from the activation energy. The first formula may also be used to predict the decay time. The two decay time predictions may be compared to establish confidence. In this manner, data retention of an ONO memory may be reliably predicted.

26 Claims, 22 Drawing Sheets

FIGURE 12: Program and erase voltages with endurance cycling at room-from model

130

Figure 13: Erase-endurance-room temp-1.98mV pulse

Figure 14: Erase-endurance-room temp-2.76mV pulse

150

Figure 15: Erase-endurance-room temp-5.36mV pulse

Figure 16: Erase-endurance 0 deg.C 9.95mV pulse

170

Figure 17: Erase-endurance-85 deg.C, 3.19mV pulse

210

METHOD OF PREDICTING RELIABILTY OF OXIDE-NITRIDE-OXIDE BASED NON-VOLATILE MEMORY

FIELD OF THE INVENTION

Embodiments of the present invention relate to the manufacture, test and qualification of integrated circuits. More particularly, embodiments of the present invention provide a method and computer aided system for predicting the reliability of oxide-nitride-oxide non-volatile memory.

BACKGROUND ART

Silicon Nitride based Non-Volatile Memory has many advantage as compared to its floating gate and tunneling oxide based counterparts. Silicon-Oxide-Nitride-Oxide-Semiconductor (SONOS) is potentially very dense in terms of number of cells per unit area that can be used and it requires fewer process steps as compared to the floating gate memory. Moreover, it can be easily integrated with the standard SRAM technology. The other advantages of using SONOS devices include their suitability for applications requiring large temperature variations and radiation hardening. There has been much apprehension in using SONOS on a wide scale in the industry because the behavior of SONOS with respect to data retention and endurance has been found unpredictable especially with variations in temperature.

There is a need for an understanding of the physical mechanism and a working model to predict the behavior of SONOS in order to reap the benefits of this technology. Attempts have been made in the past to model the physical mechanism of data retention at high temperatures. Miller, McWhorter, Dellin and Zimmermann (Journal of Applied Physics 67(11), Jun. 1, 1990, pp 7115–7124) have studied in detail the performance of "Excess Electron" states and "Excess Hole" states and their differences. The data used for this study is taken from a transistor device. A significant difference is behavior has been shown between the "Excess Electron" and "Excess hole" threshold states when the programming temperature is different from the storage temperature and the storage temperature is varied.

Other studies have led to conflicting conclusions. A study by Ross, Goodman and Duffy (RCA rev. 31,467-1970) showed that the threshold voltage decay rate of Metal-Nitride-Oxide-Silicon (MNOS) transistors was insensitive to temperatures for temperatures up to 125 degrees C. A study on NMOS transistor cycling endurance with temperature variations by Neugebauer and Burgess (Journal of Applied Physics 47,3182-1976) suggested that while charge injection for both threshold states (Excess Electron and Excess Holes) was temperature dependent, the decay rate of only the excess hole state was increased by elevating the temperature. They also found that the programming temperature, relative to the storage temperature affected the subsequent decay rate. Williams and Beguwala (IEEE Transactions on Electron Devices ED-25, 1019-1978) have found that the decay rate of only the excess electron state of MNOS transistors was temperature dependent.

Much work has been done in the past to model the erase and program properties of the SONOS non-volatile memory. Many researchers including Minami and Kamigaki ("A Novel MONOS Nonvolatile Memory Device Ensuring 10-Year Data Retention after $10^7$ Erase/ Write Cycles," IEEE Transactions on Electron Devices, vol. 40. No.11, November 1993, pp. 2011–2017) have suggested that data is written by electrons injected from the semiconductor substrate by modified Fowler-Nordheim tunneling through the $SiO_2$ and part of $Si_3N_4$ layer and are stored at traps in the $Si_3N_4$ layer. On the other hand, the holes too are injected from the semiconductor by direct tunneling through the $SiO_2$ layer and are stored at the traps in the $Si_3N_4$ layer.

There are theories about the physical location of the charge traps as well. R. Paulsen et al., (R. Paulson, R. Siergiej, M. French, M. White, "Observation of Near-Interface Oxide Traps with Charge -Pumping Technique," IEEE Transactions on Electron Devices, Vol. 13, No. 12, December 1992, pp 627–629) suggest that the traps in silicon nitride are at a well-defined trapping distance corresponding to the tunnel oxide thickness.

While all the work done in the past explains some portion of the SONOS memory program and erase mechanism, there is a need for an explanation of the behavior of SONOS memory over the entire range of temperature (e.g., the industrial temperature range) and a lifetime of program-erase cycles. The advantage of having such a prediction of data retention is that reliable products could be produced at a cost advantage compared to other types of non-volatile memories.

SUMMARY OF THE INVENTION

Therefore, it would be advantageous to provide a method and computer implemented system providing for predicting the reliability of oxide-nitride-oxide based non-volatile memory. A further need exists for a method of predicting the yield of semiconductor devices containing oxide-nitride-oxide non-volatile memory at wafer sort. A still further need exists for a method of determining activation energies for data retention and threshold voltages in oxide-nitride-oxide non-volatile memory.

A purpose of this invention is to provide a tool and a complete process to predict the life of a SONOS Non Volatile Memory element with respect to data retention at various temperatures. This invention provides relationship which utilizes the bake temperature and initial threshold margin (difference between the program threshold and the erase threshold) as input and produces the predicted time taken to reach the final threshold margin as the output. A calculation of constants is required which involves a few data points on threshold voltage margin, time and temperature as input when the model is used for a new process. The model allows yield improvement and shortens test times. The model permits the estimation of data retention life in the field based on simple test data collected in well-known procedures.

A method for predicting the reliability of oxide-nitride-oxide (ONO) non-volatile memory is disclosed. ONO memory devices may be programmed. Margin voltages may be recorded initially, and during baking at 100 degrees C. and 300 degrees C. From this data, constants and activation energy may be determined through a first formula. Frenkel-Poole activation energy may be determined using well-known methods such as charge pumping. According to embodiments of the present invention, through the use of a second formula, decay time of the information stored in the ONO memory may be predicted from the activation energy. The first formula may also be used to predict the decay time. The two decay time predictions may be compared to establish confidence. In this manner, data retention of an ONO memory may be reliably predicted, which was not possible in the conventional art.

Another embodiment of the present invention may use predictions of data retention of ONO memory in sorting integrated circuit devices containing ONO memory.

This is a first time invention of a model to predict the retention lifetime for data stored in a SONOS structure. Previous calculations have all tried to determine the distribution of charge storage or trapping sites, which is difficult to predict in a chemical vapor deposition deposited nitride and hard to calculate. This method circumvents this problem by calculating the change in the height of the oxide potential barrier which is dependent upon the decayed charge. Previously attempted methods have a strong dependence upon the quality of nitride and estimation of the location of "emission frontier" and therefore do not provide good results over the entire range of temperatures and quality of nitride. There is no standardized method to do this calculation.

The products must pass qualification requirements which involves a minimum of ten years of life with respect to data retention. Due to the lack of a model it has not been possible so far to determine how long the required data retention bake time should be. This process utilizing the model mentioned above for the first time provides a tool to accomplish this task. This process will drastically reduce the test time required to find reliable dies (with respect to data retention) in production line.

DETAILED DESCRIPTION OF THE INVENTION

Figure 1:
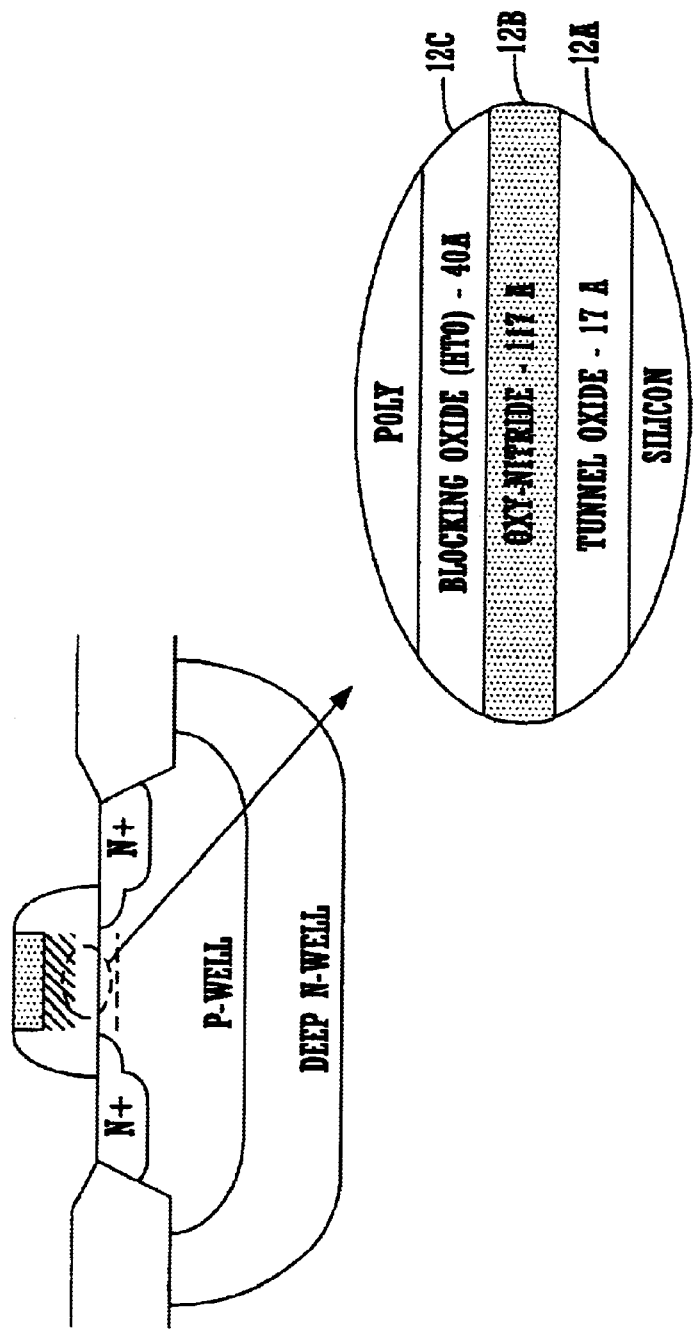
FIG. 1 is an illustration of a silicon-oxide-nitride-oxide-silicon memory cell as is well known in the conventional art.

In the following detailed description of the present invention, a method of predicting reliability of oxide-nitride-oxide based non-volatile memory, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions which follow (e.g., process 2000) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

METHOD OF PREDICTING RELIABILITY OF OXIDE-NITRIDE-OXIDE BASED NON-VOLATILE MEMORY

An embodiment of the present invention is described in the context of oxide-nitride-oxide based non-volatile semiconductor memory. However, it is appreciated that the present invention may be utilized in other types of semiconductor circuits that may use a nitride layer.

FIG. 1 shows a Silicon-oxide-nitride-oxide-silicon (SONOS) memory cell 10 as has been well known in the conventional art. The SONOS stack is a gate dielectric stack and consists of a single layer of polysilicon, a triple stack ONO (Oxide-Nitride-Oxide) gate dielectric layer and a MOS channel. The ONO structure may consist of a tunnel oxide 12a with thickness between 16 and 22 angstroms, a nitride memory storage layer 12b of equivalent electrical oxide thickness of 100 angstroms and a blocking oxide layer 12c approximately 40 angstroms thick.

The technology may consist of a double diffused well process with deep N-well for the memory array, which may contain a P well. The double diffused well allows the SONOS to be integrated into a P-type substrate CMOS process. It may have a single level of poly and the memory transistor uses an ONO stack for gate dielectric.

Figure 2:
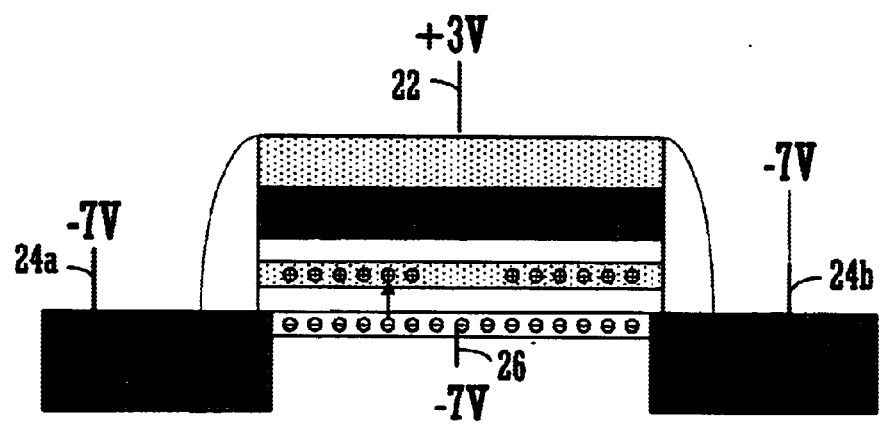
FIG. 2 depicts writing a SONOS memory cell as is well known in the conventional art.

FIG. 2 depicts writing a SONOS memory 20 as is well known in the conventional art. The writing/program operation may be done by applying positive 10 V to the gate, which causes inversion. The +10 V may be obtained by applying positive 3 V to the gate 22 and negative 7 V to the drain 24a and source 24b. Negative 7 volts may be also applied to the P well 26 to prevent forward biasing of the N+ source/drain junctions. No active channel may be formed because the transistor may be biased in such a way that source and drain are at equal potential. FIG. 2 shows the voltages at different terminals during write operation.

Figure 3:
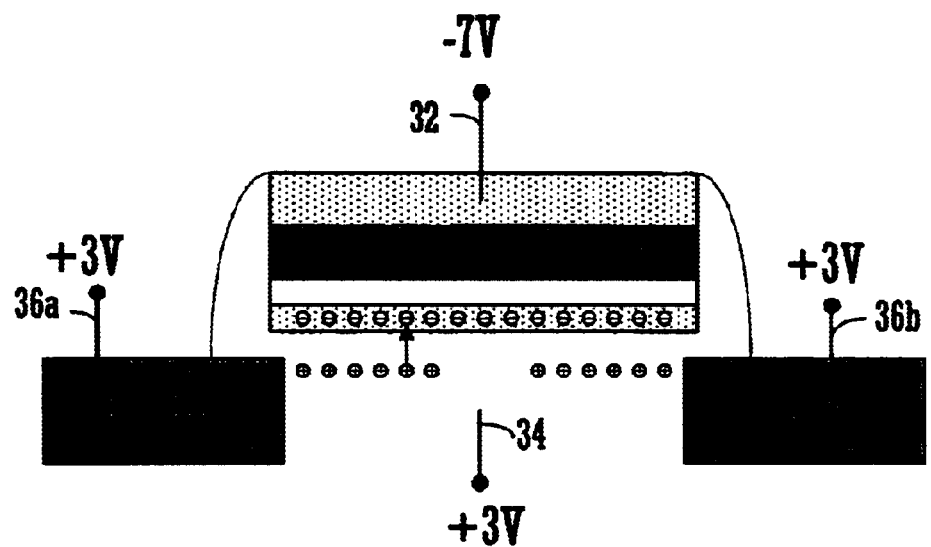
FIG. 3 depicts erasing a SONOS memory as is well known in the conventional art.

FIG. 3 depicts erasing a SONOS 30 memory as is well known in the conventional art. The erase operation may be done by applying negative 10 volts to the gate 32, which causes accumulation in the P well. This may be accomplished by applying negative 7 volts to the gate and positive 3 volts to the substrate 34. The source 36a and drain 36b are also at positive 3 volts. FIG. 3 shows the voltages at different terminals during erase operation.

Programming may be done by applying a positive voltage at the gate of the N-channel transistor. This forms an inversion layer. The charge may be injected through the oxide into the nitride by two mechanisms.

The first mechanism is Fowler-Nordheim tunneling from the substrate into the oxide through the triangular potential barrier formed by bending of the oxide conduction band. The second mechanism is direct tunneling of the carriers from the channel through the oxide into the nitride.

In order to calculate the charge stored in the nitride due to direct tunneling of electrons from the channel through the tunnel oxide, the probability of tunneling (quantum mechanical transmission coefficient) has been multiplied with the charge available in the inversion layer.

Following is the relationship for the total current density in the nitride due to the writing operation:

$$Q_n = J_c * \frac{16E(V_0 - E)}{V_0^2} * \exp\left[\frac{-2\sqrt{2*m*(V_0-E)*a}}{\hbar}\right] * t + \quad (1)$$

$$C*E^2 * \exp-\left[\frac{4\sqrt{2*m*(q*\phi_b)^{3/2}}}{3*q*\hbar*E}\right]*t$$

where t is the total time the programming voltage is applied to the gate, m is the electron mass; "a" is the thickness of the oxide, which is the width of the potential barrier, E is the applied electric field, which is simply the voltage divided by the thickness of the oxide, "q" is the electric charge and h-bar is Planck's constant divided by $2\pi$. The amount of inversion charge may be dependent upon temperature.

Erase or discharging may be assumed to be due to nitride charge loss due to Frenkel-Poole emission. The Frenkel—Poole potential barrier may be considered to be monoenergetic in the calculation. However a distribution of barrier energy can be used in the calculation if precise data is available. The value of barrier energy used in our calculation was empirically derived from the data using our model relationships. The emitted charge tunnels through the tunnel oxide into the silicon substrate.

The discharge current density therefore is the product of the Frenkel-Poole emission current density and the tunneling probability in the following way:

$$J = C_1 * E * \exp\left[-\frac{q(\phi_b - \sqrt{qE/\partial}\,Å_1)}{K*T}\right] * \quad (2)$$

$$\frac{16E(V_0-E)}{V_0^2} * \exp\left[\frac{-2\sqrt{2*m*(V_0-E)*a}}{\hbar}\right]$$

C1 is another constant and J is the total erase current density.

One notable difference between this model and all the previous models is that this model uses both Fowler Nordheim and Frenkel-Poole mechanisms to explain the data retention and endurance. In the conventional art, Minami and Kamigaki (S. Minami and Y. Kamigaki, "A Novel MONOS Nonvolatile Memory Device Ensuring 10-Year Data Retention after $10^7$ Erase/Write Cycles," IEEE Transactions on Electron Devices, vol.40. No.11, November 1993, pp. 2011–2017) have considered the writing operation to be done by electron injection and storage done by a modified Fowler Nordheim tunneling (through the $SiO_2$ and part of $Si_3N_4$). Erase, in their model, is done by hole injection from the semiconductor by direct tunneling through the $SiO_2$ layer. Some other researchers have considered various ways of Frenkel-Poole emission and direct tunneling for both write and erase operations.

As discussed above, this model assumes the programming may be done by injection of charge by Fowler-Nordheim tunneling due to bending of the oxide conduction band and also direct tunneling of the channel electrons through the tunnel oxide. The storage element is nitride (traps in the nitride are either at the interface of nitride with the tunnel oxide or at a certain depth in nitride). The depth inside nitride is not very important as long as the correct effective activation energy is known. Fowler-Nordheim tunneling has very little temperature dependence. However the channel carrier density has temperature dependence and the temperature dependence of programming voltage is due to the direct tunneling of channel carriers through the tunnel oxide into the nitride.

The erase operation on the other hand is assumed to be due to the direct tunneling (through the tunnel oxide) of the electrons trapped in the nitride (Frenkel-Poole emission) to the substrate, which is under accumulation during erase operation. Frenkel-Poole emission is a temperature dependent mechanism and therefore the temperature dependence of erase operation comes from the temperature dependence of the Frenkel-Poole emission.

Data retention is a measure of the amount of time it takes for the stored charge (charge stored during programming) to decay by a defined extent. The decay of charge changes the threshold voltage of the transistor and decay in the threshold voltage is a measure of the decay of the charge. Expected and measured threshold voltages are presented and compared in the discussion of FIGS. 6 and 7, below.

Endurance is a measure of the number of cycles of program and erase that the part can go through at a certain voltage before it gets impossible to do program or erase without either changing the pulse width or changing the voltage. In our model for endurance we have assumed that every program-erase cycle leaves a certain amount of charge behind in the nitride. The amount of charge was calculated empirically by fitting the experimental data with our model relationships.

Endurance cycling starts two competing processes-charge storage by accumulated remnant charges in the nitride and the decay of charge by the erase mechanism. At elevated temperature the decay is fast and at lower temperatures the decay process is slow. At high temperature however, the channel current is high too and the programming may store more charge than at lower temperatures. Therefore the resultant threshold voltage-endurance cycling curve at high and low temperatures may not be monotonic. This will be demonstrated later in this application with experimental data.

For both data retention and endurance, the calculation involves dynamically modifying the potential barrier of the tunneling due to varying coulombic potential on the electrons with the loss or gain of charge.

Figure 21:
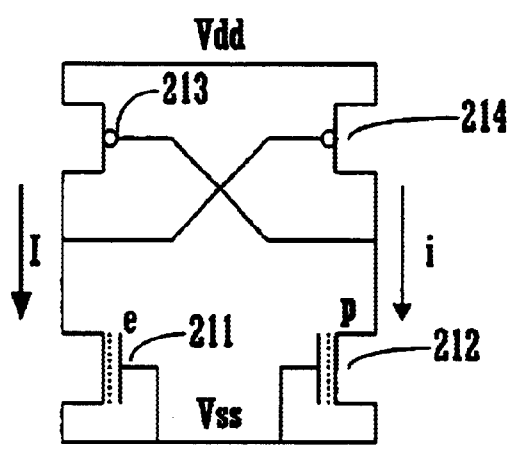
FIG. 21 shows a schematic of a silicon-oxide-nitride-oxide-silicon (SONOS) based memory cell.

FIG. 21 shows a schematic of a silicon-oxide-nitride-oxide-silicon (SONOS) based memory cell 210. SONOS erase latch 211 and SONOS program latch 212 are arranged with MOS transistors 213 and 214 in a classic cross-coupled configuration.

During a normal read, SONOS erase latch 211 and SONOS program latch 212 are tied to ground (Vss). The programmed device 212 has a positive threshold, and is off (although there are significant leakage paths, and at end of life, the threshold is actually slightly negative). The erased device 211 has a negative threshold, and that transistor is on. The difference in current between the on and off transistors drives the latch to the desired state.

In margin mode, it is possible to control the voltage on one of the two SONOS transistors, either SONOS erase latch 211 or SONOS program latch 212. The effect that this has on the circuit depends on the programmed state of the latch, and which gate is being controlled.

For example, if SONOS erase latch 211 is being controlled, positive voltages will just turn on that device even more, reinforcing the state of the latch. However, if SONOS program latch 212 is being controlled, a positive voltage turns on the device and at some point the current through the programmed device will exceed the current through the erased device. The voltage required to load the opposite of the programmed state is defined as the margin voltage. In other words, margin voltage equals threshold voltage of the program device 212 minus threshold voltage of the erase device 211.

In order to do a reliability prediction for SONOS in the standard way that predictions are made for other semiconductor technologies, it is important to see how well the experimental data fits with the Arrhenius equation. Threshold margin (difference between program threshold and erase threshold voltages) variation with time at 3 different temperatures on 300 devices were fitted into the Arrhenius plot and it was found that if 2 more terms are added to the standard Arrhenius equation, the fit is excellent. Relationship 3 is obtained by modifying the Arrhenius equation.

$$\ln(t) = \alpha + \frac{E_a}{K*T} + \beta*Margin + \Upsilon*\frac{Margin}{T} \qquad (3)$$

Using this relationship, according to an embodiment of the present invention, a near perfect fit is obtained with the experimental data. Where 't' is the data retention bake time, T is the temperature, K is the Boltzmann constant and "Margin" is the difference between write and erase thresholds. The terms $\alpha$, $\beta$ and $\Upsilon$ are constants.

Figure 4:
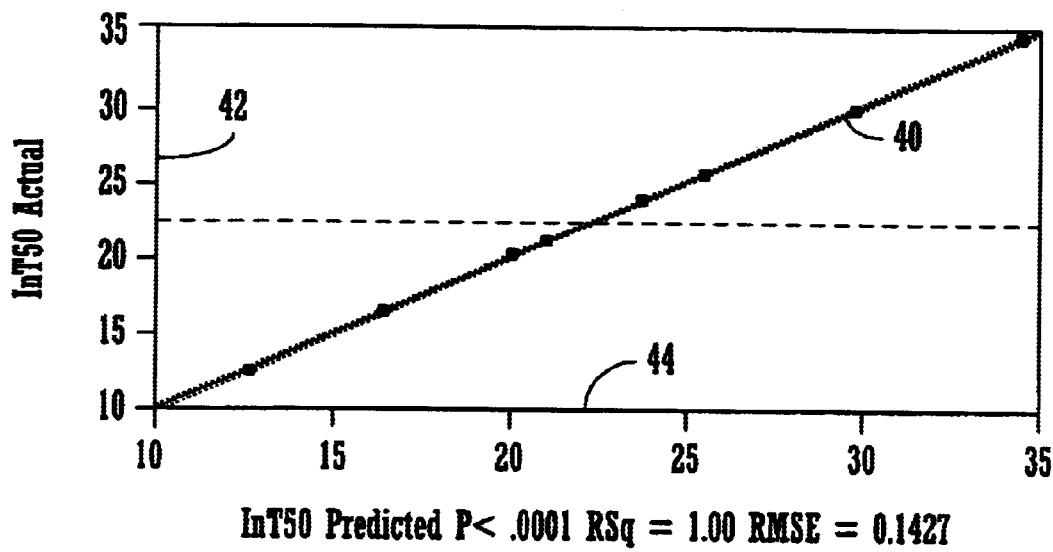
FIG. 4 shows a graph comparing the predicted data for $t_{50}$ with the actual $t_{50}$ data according to embodiments of the present invention.

FIG. 4 shows a graph 40 comparing the predicted data 44 for $t_{50}$ with the actual $t_{50}$ data 42. It is a plot of actual versus predicted times to achieve a given amount of window or margin narrowing. The summary of the fit of the data presented in FIG. 4 is given in table 1 below.

TABLE 1

| Summary of Fit | |
|---|---|
| RSquare | 0.999709 |
| RSquare Adj | 0.999534 |
| Root Mean Square Error | 0.14269 |
| Mean of Response | 22.17134 |
| Observations (or Sum Wgts) | 9 |

Table 2 below gives the calculated values of the constants in the statistically derived relationship.

TABLE 2

| Parameter Estimates Term | Estimate | Std Error | t Ratio | Prob>[t] |
|---|---|---|---|---|
| Intercept | −5.810043 | 0.273598 | −21.24 | <.0001 |
| β | −0.015248 | 0.000194 | −78.53 | <.0001 |
| $E_a$ | 12834.846 | 123.5866 | 103.85 | <.0001 |
| γ | −7.132552 | 0.50454 | −14.14 | <.0001 |

Table 2 has the calculated values of the constants with the t-test values and standard error values. The values obtained above may not necessarily apply to all window values, all programming voltages and all technologies. However, the form of the relationship stays the same and the fit with the real data is normally very good.

Figure 5:
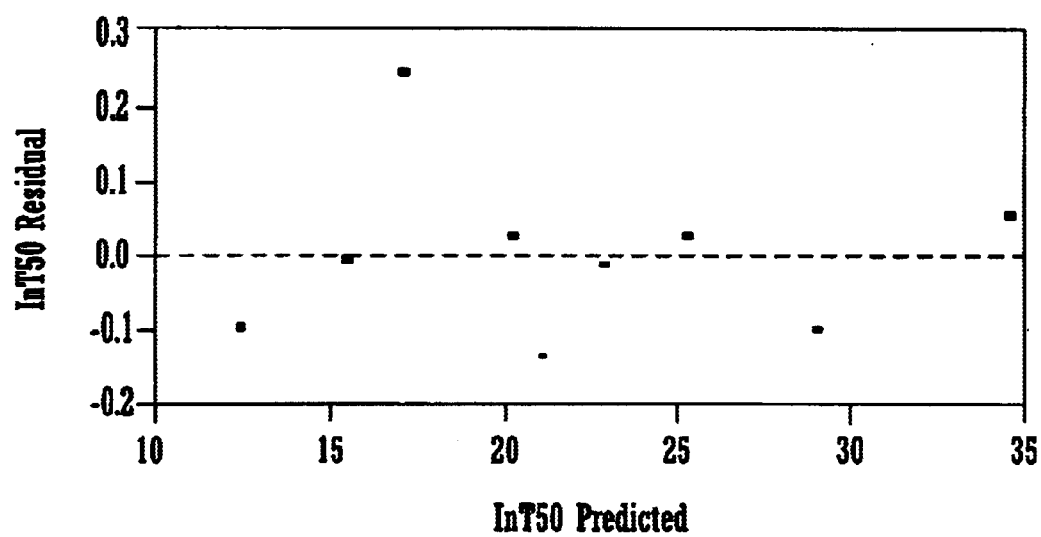
FIG. 5 shows the residuals from fitting predicted data, according to an embodiment of the present invention.

FIG. 5 is a graph 50 which shows the residuals from the fitting. This demonstrates the quality of fit to the actual data and the plot shows that the misfit does not show a pattern. This means that no systematic effect has been left behind in the statistical modeling.

An examination of relationship (3) shows that it is an Arrhenius equation with two more factors both related to the threshold window or margin. Physically, margin would include the amount of charge deposited during programming and also the barrier energy of Frenkel-Poole emission. This relationship therefore does take into account the trap depth in the nitride. The relationship shows that the decay time of the charge (or window narrowing) will be exponentially dependent upon the trap depth or Frenkel-Poole barrier energy. Higher barrier energies lead to greater decay time.

Relationship 2 is a relationship of effective decay current density of the programmed charge. This relationship can be manipulated to obtain an relationship for the time needed for the programmed charge to decay. Relationship 4 is obtained by dividing the programmed charge (a constant) by the current density.

$$\ln(t) = \ln\left(\frac{C}{E}\right) + \left[\frac{q*(\phi_b - \sqrt{qE - \pi\varepsilon_l})}{K*T}\right] + \quad (4)$$

$$\ln\left(\frac{V_0^2}{16*E*(V_0 - E)}\right) + \left[\frac{2*\sqrt{2*m*(V_0 - E)}*a}{\hbar}\right]$$

Where C is a constant in relationship 4. A comparison of relationship (4) with relationship (3) shows that a correspondence can be made between the two relationships, since the margin depends upon the applied field E and the potential barrier $V_0$.

It may be seen that the second term in relationship (4) corresponds to the second and fourth terms in relationship (3) and the first term in relationship (3) corresponds to the rest of the terms in relationship (4), assuming that the electric field E and the barrier energy $\phi_b$ remain constant.

Data obtained from experiments was first used to calculate the amount of charge stored in the nitride during programming by multiplying the current density obtained from the above relationships with the time for a certain threshold voltage. This data may then be used to tune the model to predict the shift of Vt at different temperatures, both for program and for erase.

Figure 6:
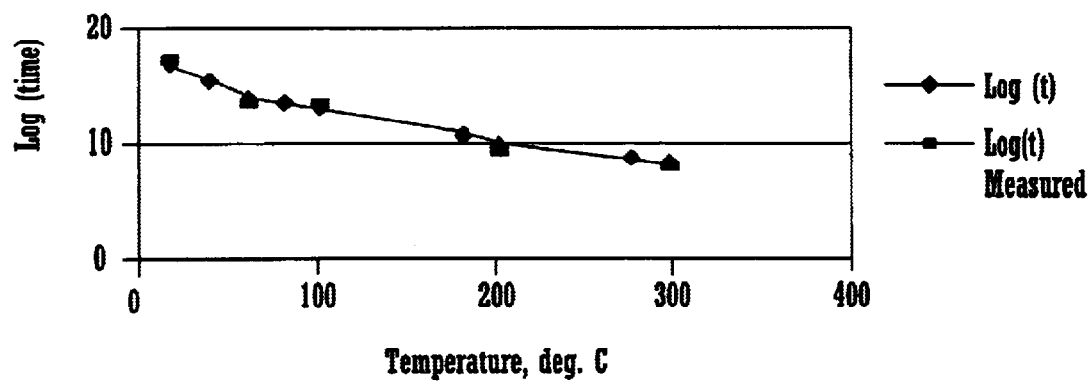
FIG. 6 shows a graph of actual versus predicted threshold voltages at different temperatures, according to an embodiment of the present invention.
Figure 7:
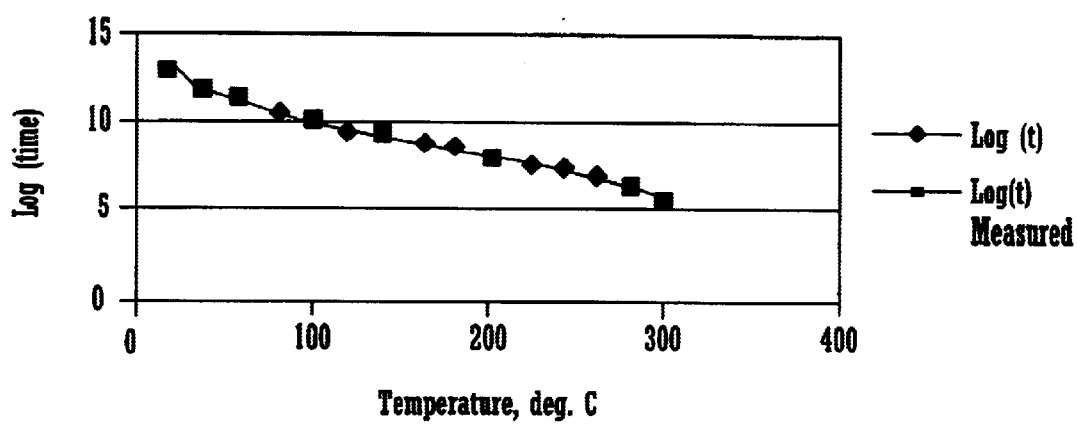
FIG. 7 shows a plot of actual versus predicted threshold voltages for the devices used in FIG. 1 for a final threshold voltage of close to 0 mV, according to an embodiment of the present invention.

FIGS. 6 and 7 compare the data obtained from the model with the data obtained experimentally.

The graph 60 in FIG. 6 shows actual versus predicted threshold voltages at different temperatures. The data retention in graph 60 is defined as decay of the threshold voltage from 1.5 V to close to 300 mV. The experimental threshold voltage data was obtained by averaging the threshold voltages of 300 parts.

FIG. 7 shows a plot 70 of actual versus predicted threshold voltages for the devices used in FIG. 1 for a final threshold voltage of close to 0 mV. In the model, the lowest threshold voltage to fit the data is 1.2 mV.

It is appreciated that the time scale is logarithmic, which has resulted in the disappearance of smaller differences between the model prediction and the experimental data. However the model, to a good extent provides prediction of the data retention lifetime of the device.

Figure 8:
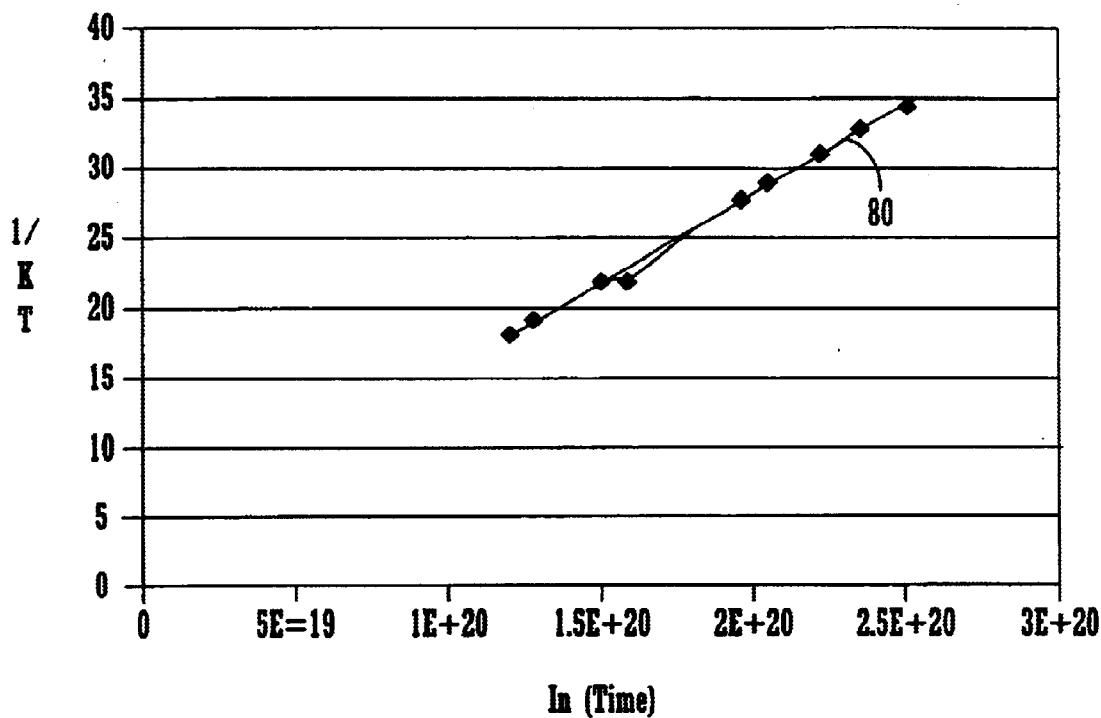
FIG. 8 shows a straight line fitted with the ln (time) to 1/KT plot from the data obtained from the model for erase, according to an embodiment of the present invention.

FIG. 8 shows a straight line 80 fitted with the ln (time) to 1/KT plot from the data obtained from the model for erase. The activation energy obtained this way (0.85 in this particular case) is very close to 0.91 effective activation energy obtained statistically.

Figure 9:
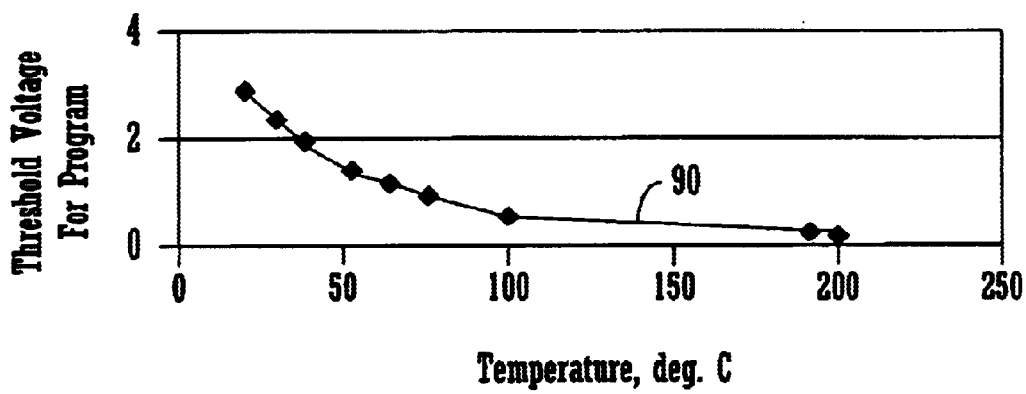
FIG. 9 shows a graph of correlation between the temperature and the threshold voltage for programming, according to an embodiment of the present invention.

FIG. 9 shows a correlation 90 between the temperature and the threshold voltage for programming. This calculation is based on some assumptions about the channel doping density and the initial threshold voltage. The graph 90 shows a rapid decrease in the threshold voltage in the beginning followed by a semi-saturation or gradual decrease. This is a prediction from the model and matches the experimentally obtained data closely.

As the temperature increases the number of electrons in the channel increases too. Because of that, there are more electrons available to tunnel through the tunnel oxide into the nitride. As a result of this, more charge is stored in the nitride during programming, bringing the threshold voltage down.

Figure 10:
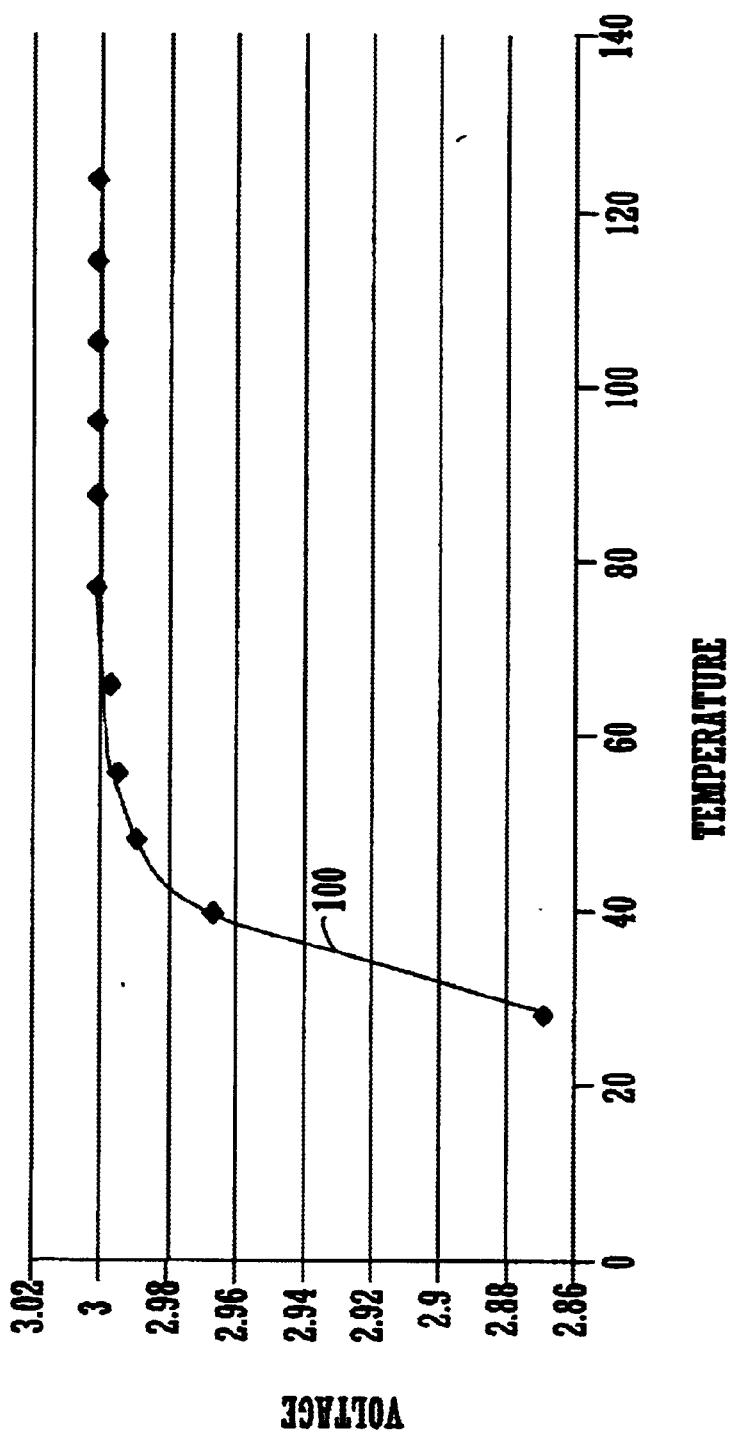
FIG. 10 is a graph of a typical rise in erase threshold voltage with temperature, as obtained from experimental results.

With temperature going up the minimum erase voltage is predicted to first go up and then almost stabilize with very gradual downward trend. FIG. 10 represents a graph 100 illustrating typical rise in erase threshold voltage with temperature.

Figure 11:
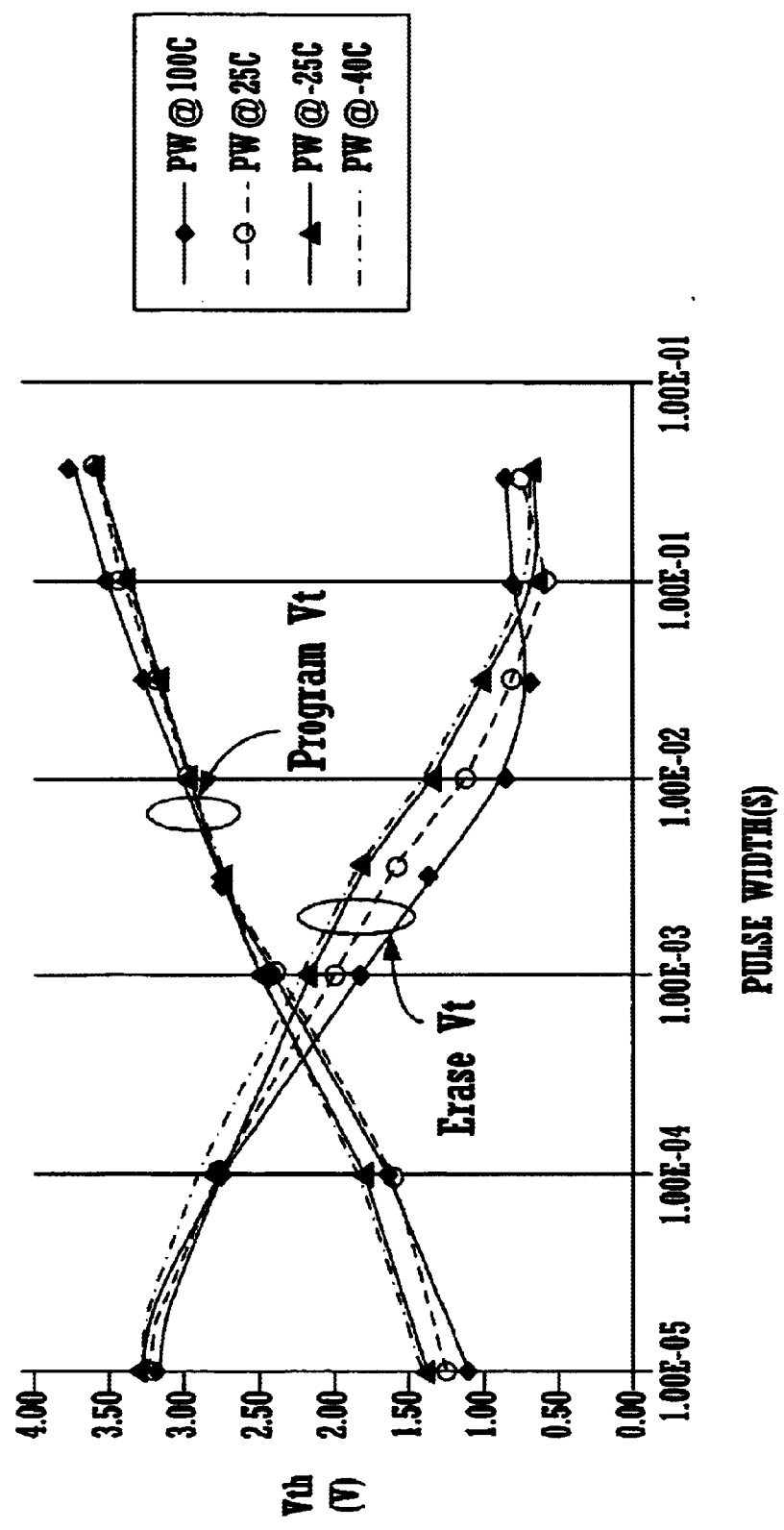
FIG. 11 is a graph of experimentally obtained data for threshold voltage (Vt) versus an erase/program pulse width at several temperatures.

FIG. 11 is a graph 110 of experimentally obtained data for threshold voltage (Vt) versus an erase/program pulse width at several temperatures.

Graph 110 shows that for all temperatures, the Vt of a programmed transistor goes up with increasing pulse width of programming (because more charge is being stored). Further, the Vt of an erased transistor goes down with increasing pulse width because more charge is removed. This happens at all temperatures and the effect for the erase transistor is more pronounced at high temperatures.

This data demonstrated that an erase process has more temperature dependency than the program process, which aligns with Frenkel-Poole emission idea because Frenkel-Poole emission is temperature dependent.

With an increase in temperature, the Frenkel-Poole emission increases and the rate of charge decay goes up.

This reduces the amount of electrons deposited in the nitride more rapidly, which in turn increases the threshold voltage more rapidly. The saturation in the threshold voltage is brought about by a reduction in the decay of electrons caused by an effective increase in the nitride to oxide potential barrier.

An assumption has been made that the program-erase cycle leaves a certain amount of charge behind in the nitride every cycle. This charge brings down the oxide potential barrier by a certain amount every cycle, until all the mid gap charge traps are full. This affects the amount of minimum voltage needed to store the same amount of charge in the nitride after every cycle.

Therefore, the threshold voltage for program and erase are affected. In the calculation used for the data below, it has been assumed that each cycle leaves 0.01% of the charge behind.

Figure 12:
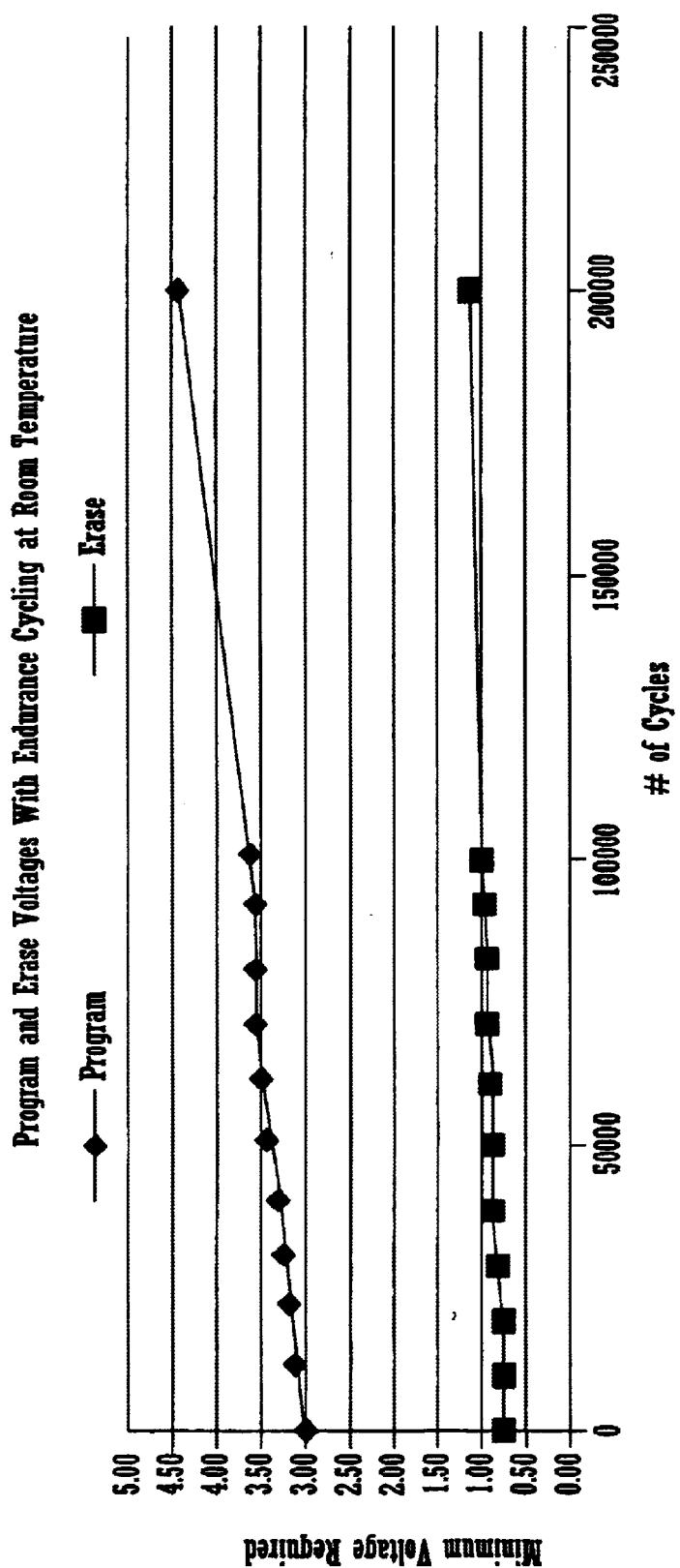
FIG. 12 is a graph of program and erase voltages versus endurance cycling data obtained from embodiments of the present invention.

FIG. 12 is a graph 120 of program and erase voltages versus endurance cycling data obtained from embodiments of the present invention.

FIGS. 13, 14, 15, 16 and 17 show the calculated shift of minimum required erase voltage with different pulse widths, temperatures and number of program-erase cycles.

Figure 13:
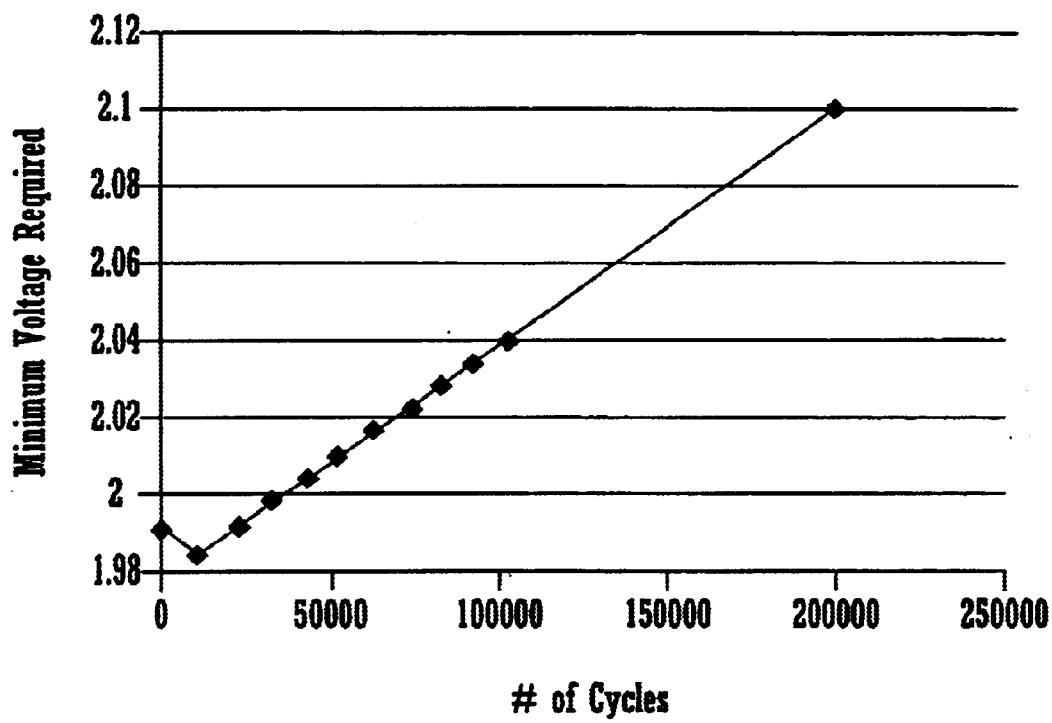
FIGS. 13, 14, 15, 16 and 17 show a related family of graphs of the calculated shift of minimum required erase voltage with different pulse widths, temperatures and number of program-erase cycles, according to embodiments of the present invention.

FIG. 13 shows a graph 130 of the minimum voltage required for erasure with respect to the number of program erase cycles at room temperature and a 1.98 mV pulse.

Figure 14:
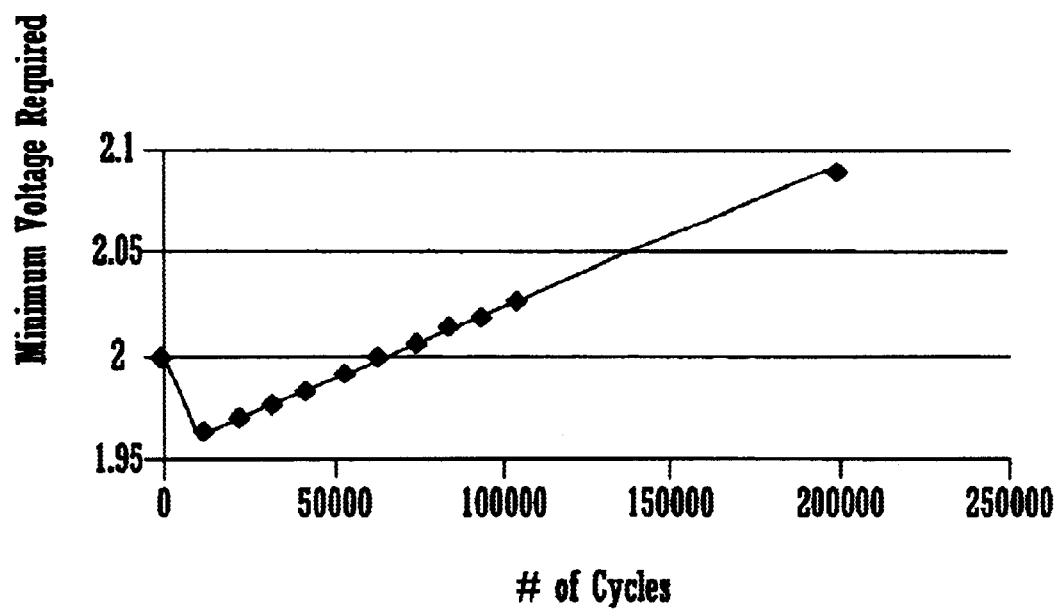

FIG. 14 shows a graph 140 of the minimum voltage required for erasure with respect to the number of program erase cycles at room temperature and a 2.76 mV pulse.

Figure 15:
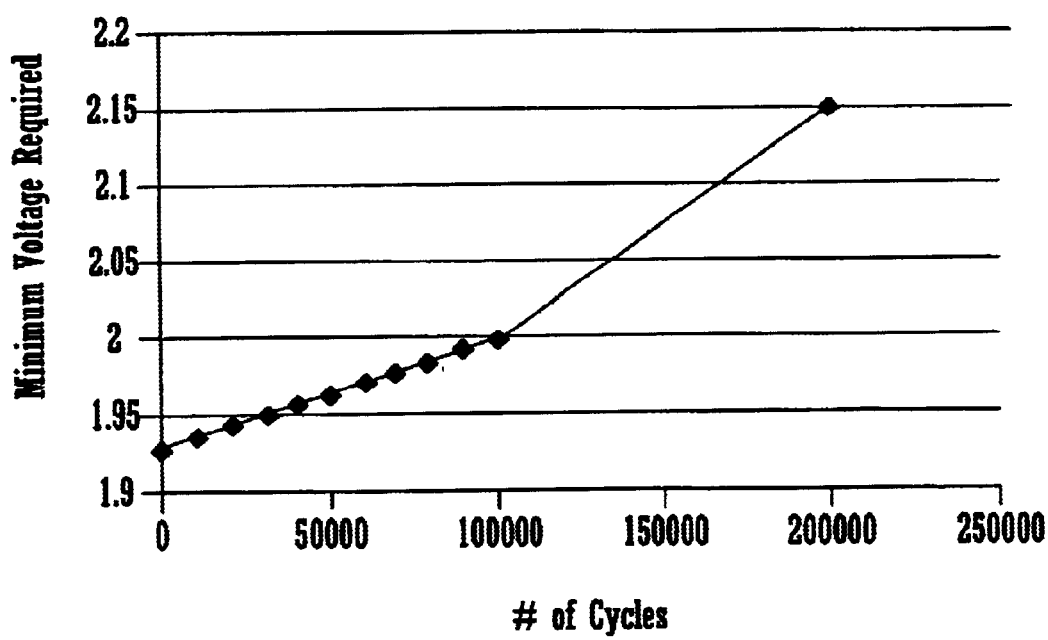

FIG. 15 shows a graph 150 of the minimum voltage required for erasure with respect to the number of program erase cycles at room temperature and a 5.36 mV pulse.

Figure 16:
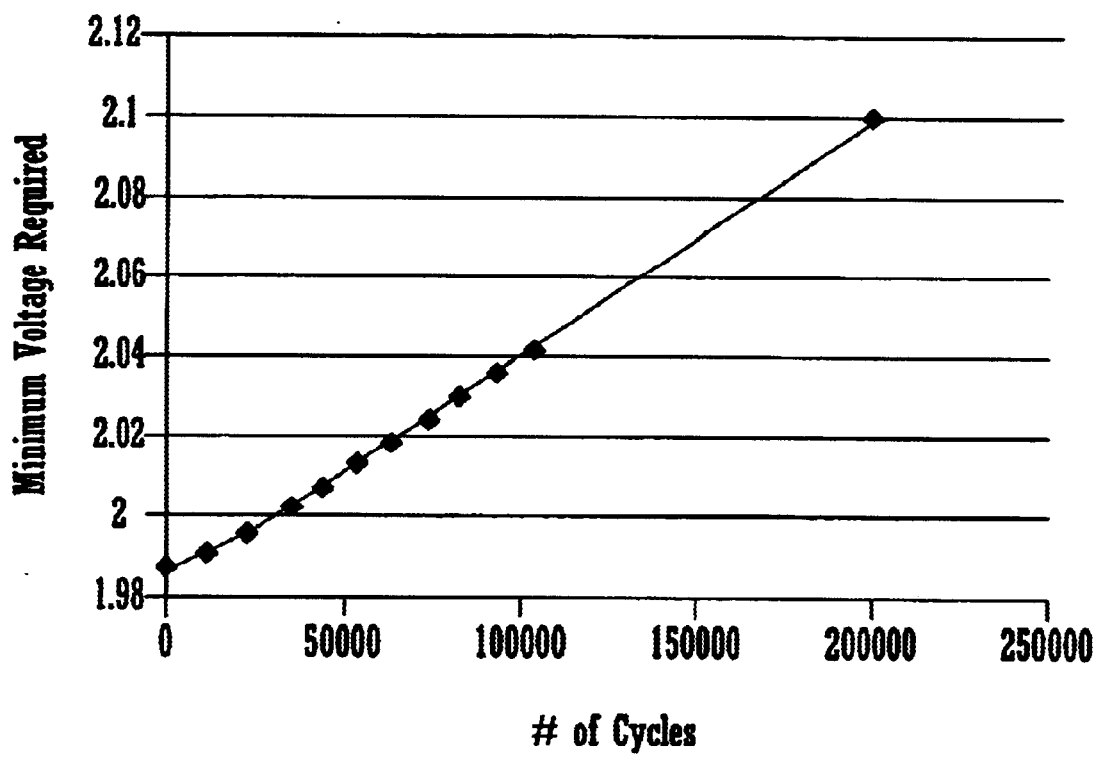

FIG. 16 shows a graph 160 of the minimum voltage required for erasure with respect to the number of program erase cycles at zero degrees C. and a 9.95 mV pulse.

Figure 17:
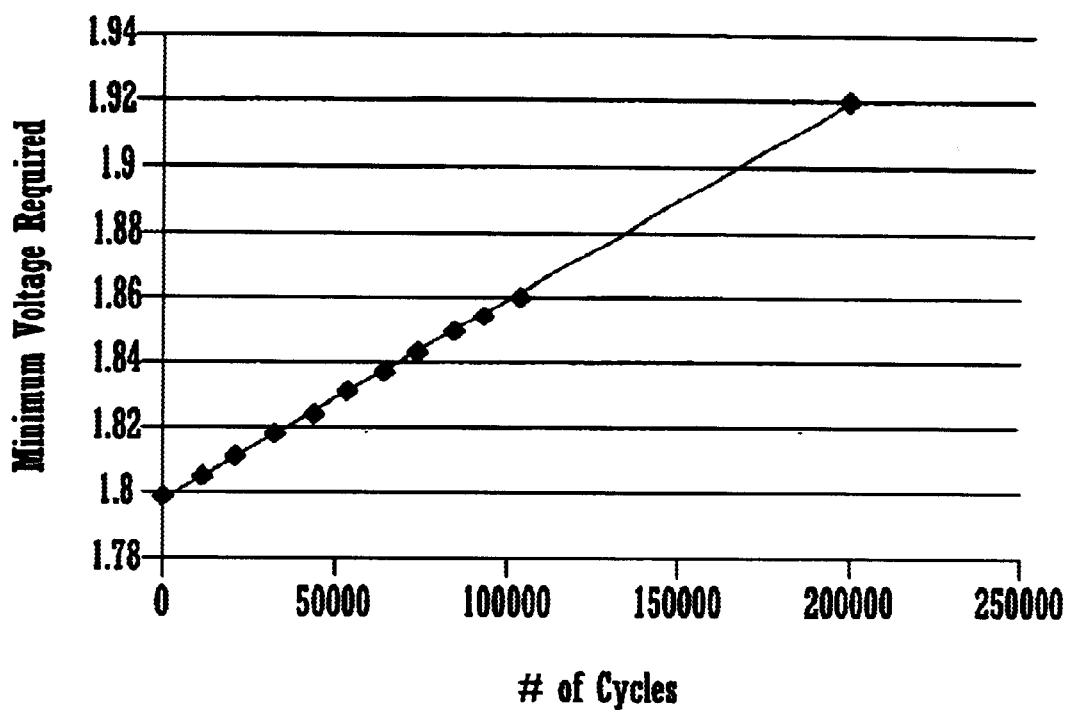

FIG. 17 shows a graph 170 of the minimum voltage required for erasure with respect to the number of program erase cycles at 85 degrees C. and a 3.19 mV pulse.

As mentioned previously, the program-erase cycle appears to leave behind a small amount of charge in the nitride. This increases the potential barrier of the oxide both with respect to silicon (electrons flow from silicon to nitride during programming through the oxide) and with respect to nitride (for erase, electrons flow from nitride to silicon-through the oxide). The increase in the potential barrier is because of storage of electrons, which applies repulsive force on the electron trying to tunnel through the oxide.

An increase in oxide potential barrier results in less charge being able to tunnel through the oxide which will require higher voltage both for programming and for erasing.

Erasing is a combination of Frenkel-Poole emission and direct tunneling through the oxide. Frenkel-Poole emission increases with increase in the erase voltage and also increase in temperature. However tunneling through the oxide is dependent upon the oxide potential barrier in such a way that an increase in the size of the potential barrier may increase or decrease the minimum voltage required based on the difference between the oxide potential barrier and the applied voltage.

This may be seen by examining the tunneling relationship given earlier. This explains why at low pulse widths (which deposit lower amount of charge in the nitride) the minimum voltage first decreases and then increases. The decrease happens when the applied voltage is close to the potential barrier between nitride and oxide. One finding from the model is that at low temperature, larger pulse widths are needed for erase or program.

Figure 18:
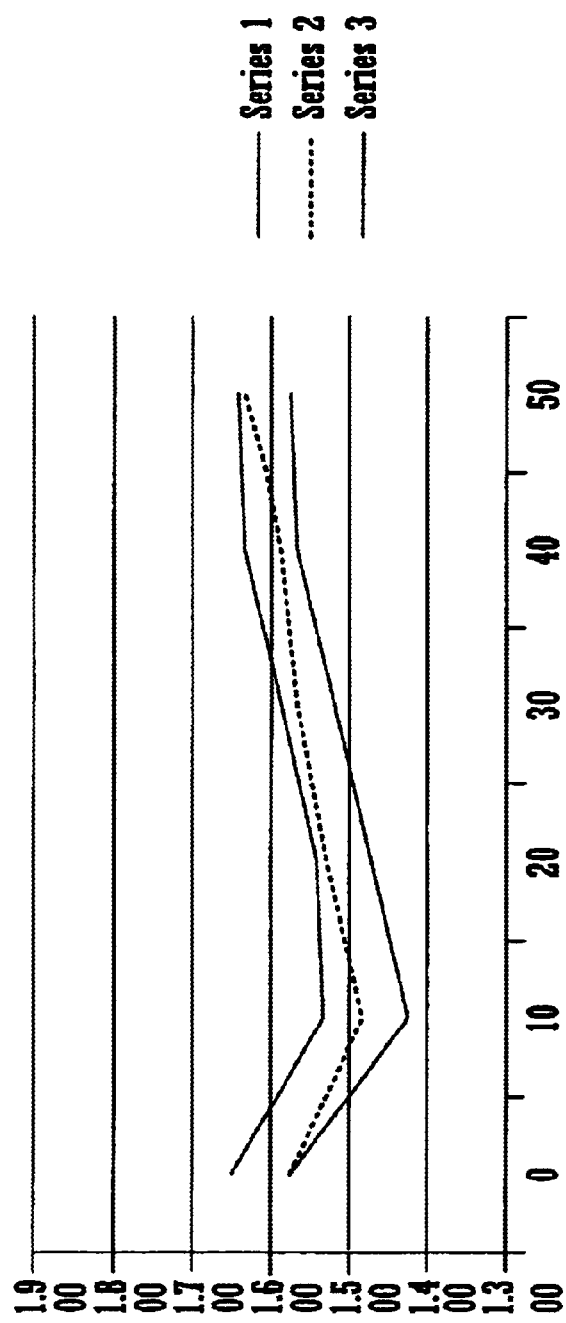
FIG. 18 is a graph of experimentally obtained data for minimum erase voltage for pulse width=3.63 mS.

FIG. 18 shows the experimentally obtained data for minimum erase voltage for pulse width=3.63 mS. The graph 180 shows an initial decrease in the minimum voltage followed by an increase. The model as shown in FIGS. 13, 14 and 16 predicts this characteristic of the graph.

Figure 19:
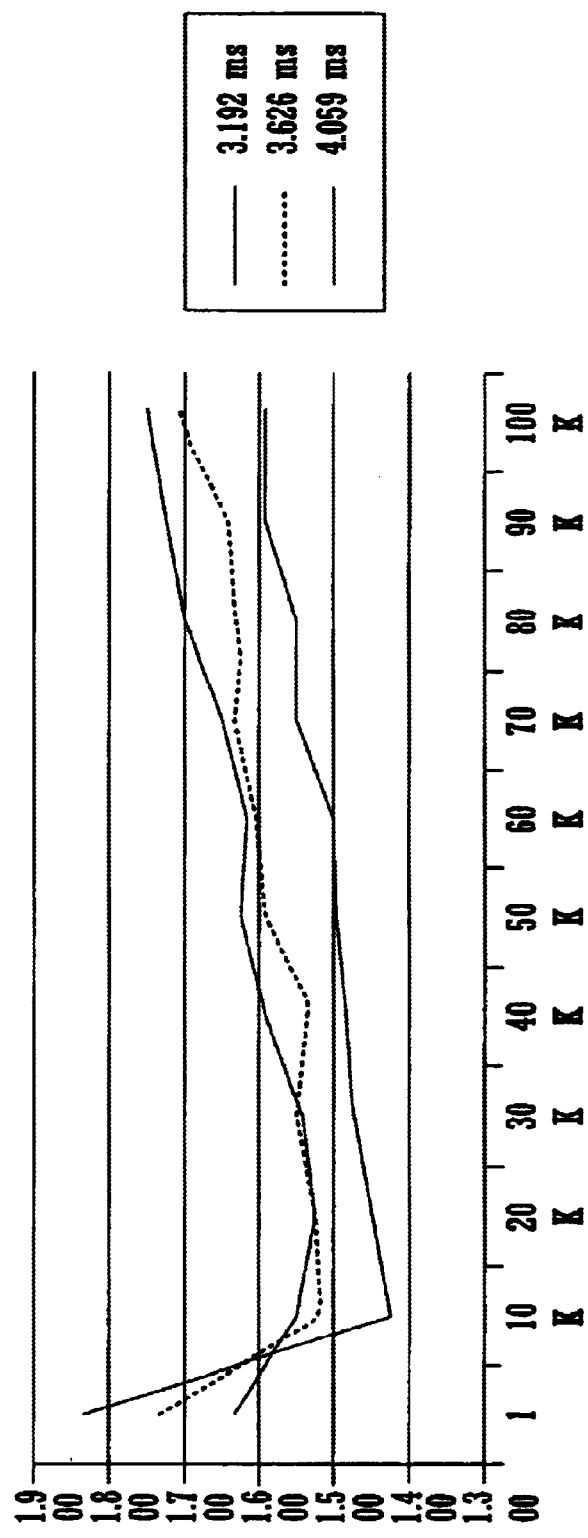
FIG. 19 is a graph showing experimental data on variation of minimum erase voltage with program-erase cycling at zero degrees C.

FIG. 19 is a plot 190 that shows the variation of minimum erase voltage with program-erase cycling at zero degrees C. As the temperature goes down, the pulse width has to be larger. This can be seen from the model as well.

Figure 20:
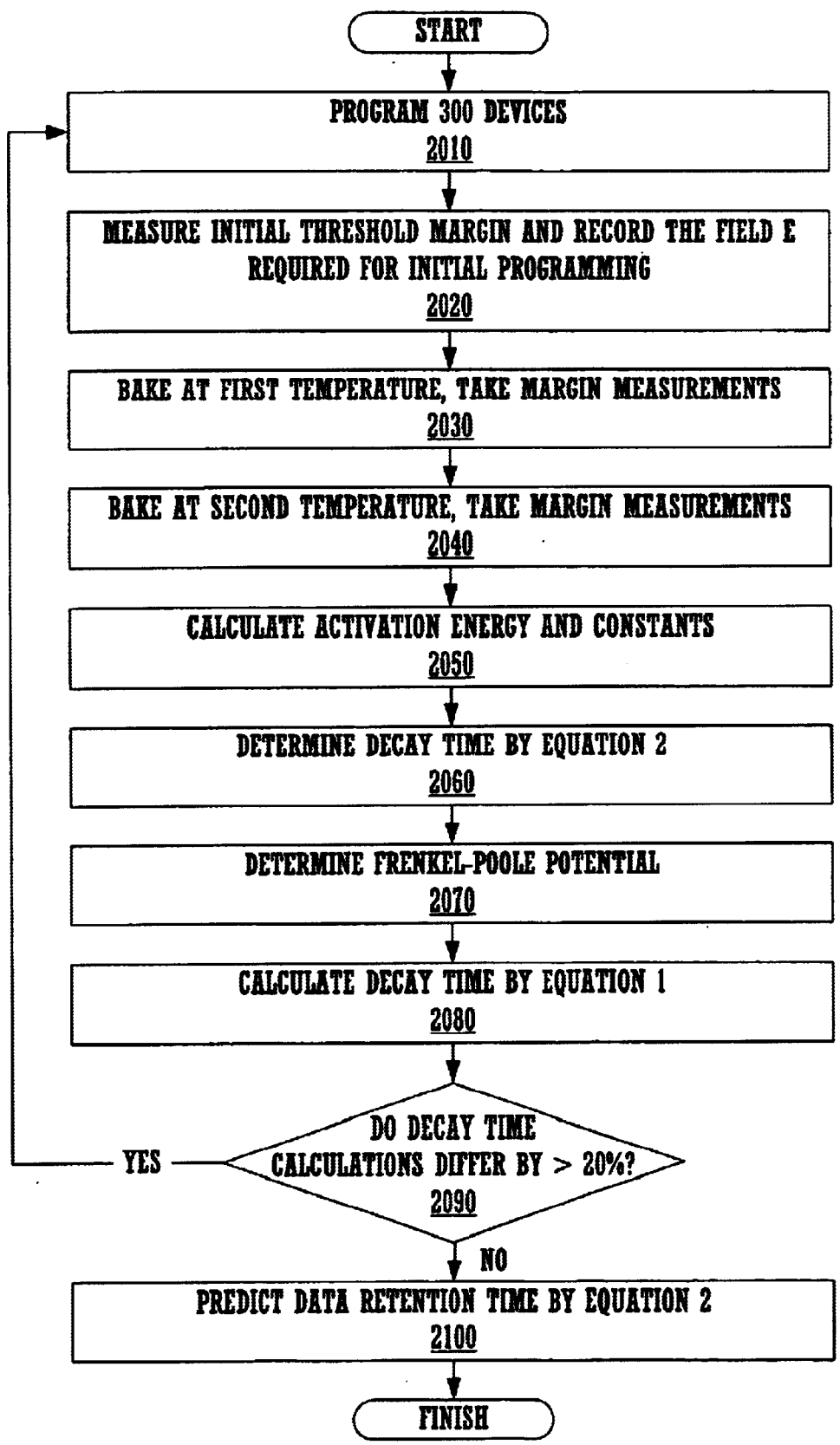
FIG. 20 is a flow diagram of a method of predicting the data retention time of ONO memory, in accordance with embodiments of the present invention.

FIG. 20 is a flow diagram of a method 2000 of predicting the data retention time of ONO memory, in accordance with an embodiment of the present invention. Method 2000 may be implemented on a computer system, for example system 600 of FIG. 22.

In step 2010, a quantity of memory devices, for example 300, may be programmed. It is appreciated that this quantity may be sampled from a production run according to a number of well-known quality assurance sampling methods in accordance with embodiments of the present invention.

In step 2020, the initial threshold margin and field E required for initial programming are measured. These initial values may be measured and recorded at nominal room temperatures.

In step 2030, the programmed memory devices may be baked at a first temperature, for example 100 degrees C. During the baking period, margin measurements may be made at a variety of time intervals, for example, at 24 hours, 48 hours and 168 hours. It is appreciated that other intervals are well suited to embodiments of the present invention.

In step 2040, process step 2030 may be repeated for a different baking temperature, for example 300 degrees C.

In step 2050, the activation energy Ea, and constants $\beta$ and Y from the relationship $\ln(t)=\alpha+Ea/(K^*T)+\beta^*margin+Y^*margin/T$ may be determined from the data obtained in steps 2020 through 2040.

In step 2060 of FIG. 20, the decay time t may be calculated by $\ln(t)=\alpha+Ea/(K^*T)+\beta^*margin+Y^*margin/T$.

In step 2070, the Frenkel-Poole activation energy may be determined by a well known process, for example by charge pumping.

In step 2080, the decay time may be calculated by calculating $\sqrt{qE/\pi\epsilon_i}$ where q is the electronic charge and E is the applied electric field using equation 4.

In step 2090 the two calculated decay times may be compared. A significant difference, for example a difference greater than 20%, may indicate an error in calculation, data measurement and recording, or production, and embodiments of the present invention may begin anew at step 2010 if such a large difference is found.

If the two calculated decay times compare within 20%, process flow may continue to step 2100. In step 2100, the data retention time may be predicted by the relationship $\ln(t)=\alpha+Ea/(K^*T)+\beta^*margin+Y^*margin/T$. In this manner, the data retention time of an ONO based memory may be predicted.

The predicted data retention times may be recorded and associated with the corresponding integrated circuit devices. Some uses of these predictions are discussed below.

Whereas in the conventional art there was no method to accurately predict the data retention reliability of ONO memories, embodiments of the present invention provide such a capability. With this ability, a designer and/or manufacturer of integrated circuits containing ONO memory may be able to certify to its customers that such integrated circuit devices meet a given standard of performance. One such method may be to publish test data in reliability reports, and present data retention predictions based on such test data. Absent embodiments of the present invention, no such statements can be made definitively by competitors.

Further, a semiconductor manufacturer may employ embodiments of the present invention to certify or qualify a memory design and production process. This may simplify and shorten the qualification process, resulting in significant competitive advantages, including time to market and lower costs.

In addition, a semiconductor manufacturer may employ embodiments of the present invention to sort integrated circuit die at the wafer level according to data retention criteria. Based upon the prediction, die may be rejected as unacceptable. It is appreciated that there may be different data retention criteria, for example, long life parts that require ten years of data retention, and short life which may require only two years of data retention. Rejection of a die because it is not projected to meet a high standard does not necessarily mean that the die is unacceptable for all uses.

Being able to perform such a sort at the wafer level may result in significant cost savings. Savings may arise in several forms, including reduced warranty costs, reductions in test time, cost savings and in identifying unacceptable material earlier in the manufacturing process (for example, prior to packaging). Further, the capability of predicting reliability and sorting at the wafer level based on such predictions may create addition market segmentation for various reliability standards.

Figure 22:
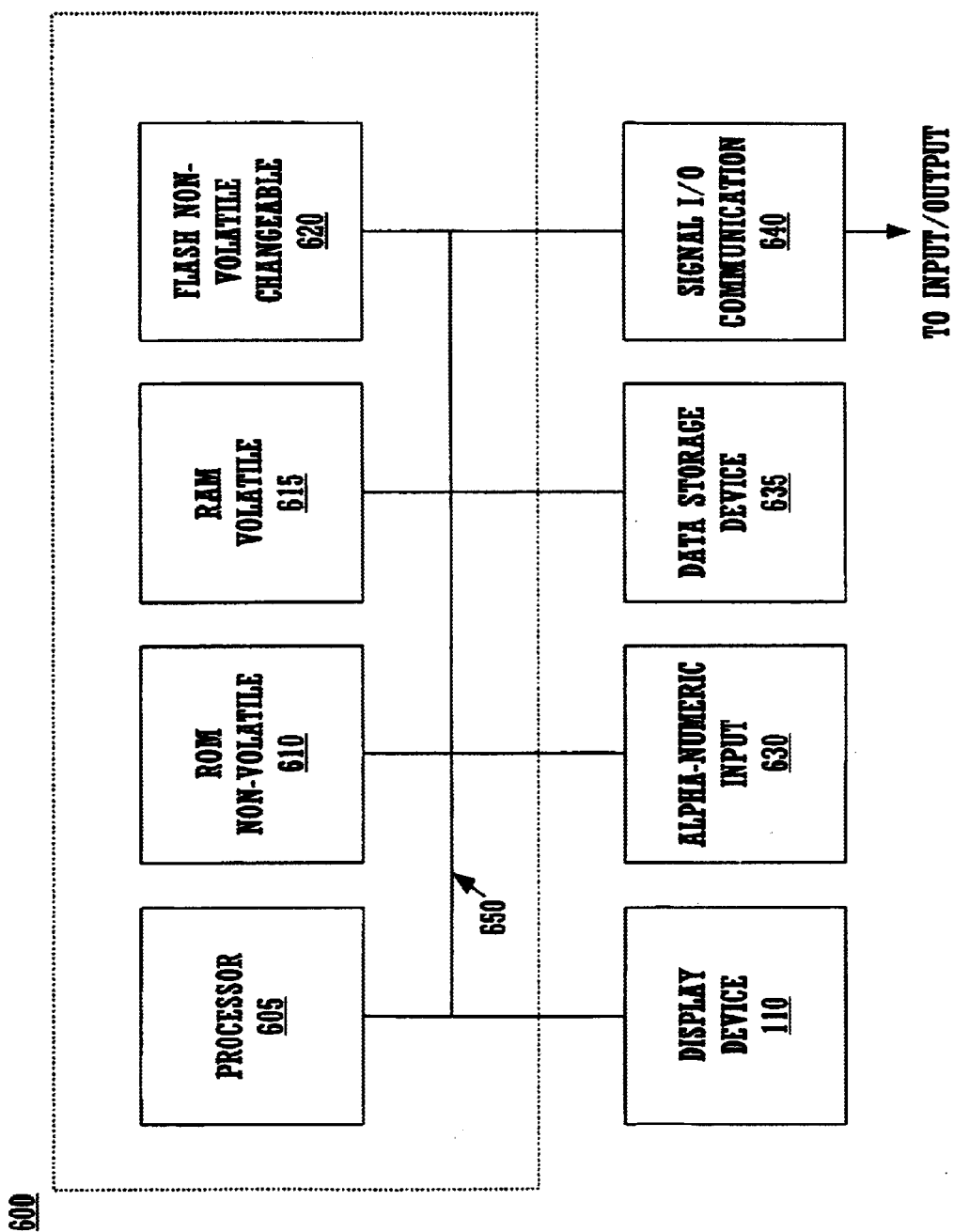
FIG. 22 illustrates circuitry of computer system, which may form a platform for the implementation of embodiments of the present invention.

FIG. 22 illustrates circuitry of computer system 600, which may form a platform for the implementation of embodiments of the present invention. Computer system 600 includes an address/data bus 650 for communicating information, a central processor 605 functionally coupled with the bus for processing information and instructions, a volatile memory 615 (e.g., random access memory RAM) coupled with the bus 650 for storing information and instructions for the central processor 605 and a non-volatile memory 610 (e.g., read only memory ROM) coupled with the bus 650 for storing static information and instructions for the processor 605. Computer system 600 also optionally includes a changeable, non-volatile memory 620 (e.g., flash) for storing information and instructions for the central processor 605, which can be updated after the manufacture of system 600.

Computer system 600 also optionally includes a data storage device 635 (e.g., a rotating magnetic disk) coupled with the bus 650 for storing information and instructions.

Also included in computer system 600 of FIG. 22 is an optional alphanumeric input device 630. Device 630 can communicate information and command selections to the central processor 600. Device 630 may take the form of a touch sensitive digitizer panel or typewriter-style keyboard. Display device 625 utilized with the computer system 600 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 640 is also coupled to bus 650.

The preferred embodiment of the present invention a system and method for a method of predicting reliability of oxide-nitride-oxide based non-volatile memory is thus described. While the present invention has been described in particular embodiments, it should be appreciated that the present invention should not be construed as limited by such embodiments, but rather construed according to the below claims.

What is claimed is:

1. In a computer system, a method for predicting the data retention time of a bit stored in an oxide-nitride-oxide non-volatile memory comprising:
    a) solving the relationship $\ln(t) = \alpha + Ea/(K^*T) + \beta^*margin + Y^*margin/T$; and
    b) using the value of t from said relationship to predict said data retention time for said bit stored in said oxide-nitride-oxide based non-volatile memory.

2. The method as described in claim 1 wherein said Ea, said β and said Y are determined by comparing empirical data of said oxide-nitride-oxide based non-volatile memory for change in threshold margin at multiple temperatures.

3. The method as described in claim 2 further comprising:
    c) programming said non-volatile memory;
    d) measuring threshold margin and field E required for said programming;
    e) baking said memory at a first temperature;
    f) measuring threshold margin after the completion of said e);
    g) baking said memory at a second temperature; and
    h) measuring threshold margin after the completion of said g).

4. The method as described in claim 3 wherein said first temperature is substantially similar to 100 degrees C.

5. The method as described in claim 3 wherein said second temperature is substantially similar to 300 degrees C.

6. The method as described in claim 2 further comprising:
    computing $(\sqrt{qE/\pi\epsilon_i})$ minus $(Ea - Y^*K^*margin)$ to produce a difference; and
    accepting said data retention time as valid if said difference is less than substantially 20%.

7. A computer implemented method of sorting integrated circuits is comprising:
    a) predicting the data retention time of an oxide-nitride-oxide based non-volatile memory; and
    b) rejecting said oxide-nitride-oxide based non-volatile memory at wafer sort if said data retention time is below a threshold value.

8. The method as described in claim 7 wherein said a) further comprises:
    a1) solving the relationship $\ln(t) = \alpha + Ea/(K^*T) + \beta^*margin + Y^*margin/T$; and
    a2) using the value of t from said relationship to predict said data retention time.

9. The method as described in claim 8 wherein said Ea, said β and said Y are determined by comparing empirical data for change in threshold margin at multiple temperatures.

10. The method as described in claim 9 further comprising:
    c) programming said non-volatile memory;
    d) measuring threshold margin and field E required for said programming;
    e) baking said memory at a first temperature;
    f) measuring threshold margin after the completion of said e);
    g) baking said memory at a second temperature; and
    h) measuring threshold margin after the completion of said g).

11. The method as described in claim 10 wherein said first temperature is substantially similar to 100 degrees C.

12. The method as described in claim 10 wherein said second temperature is substantially similar to 300 degrees C.

13. The method as described in claim 8 further comprising:
    computing $(\sqrt{qE/\pi\epsilon_i})$ minus $(Ea - Y^*K^*margin)$ to produce a difference; and
    accepting said data retention time as valid if said difference is less than substantially 20%.

14. A method of demonstrating the data retention of oxide-nitride-oxide memory comprising:
    a) listing margin voltage measurements of oxide-nitride-oxide memory at two or more substantially different temperatures in a report; and
    b) computing predicted data retention times from said measurements in said report.

15. The method as described in claim 14 wherein said b) further comprises:
    b1) solving the relationship $\ln(t) = \alpha + Ea/(K^*T) + \beta^*margin + Y^*margin/T$; and
    b2) using the value of t from said relationship to predict said data retention time.

16. The method as described in claim 15 wherein said Ea, said β and said Y are determined from said report.

17. The method as described in claim 15 further comprising:
    c) programming said non-volatile memory;
    d) measuring threshold margin and field E required for said programming;
    e) baking said memory at a first temperature;
    f) measuring threshold margin after the completion of said e);
    g) baking said memory at a second temperature; and
    h) measuring threshold margin after the completion of said g).

18. The method as described in claim 17 wherein said first temperature is substantially similar to 100 degrees C.

19. The method as described in claim 17 wherein said second temperature is substantially similar to 300 degrees C.

20. A computer system comprising:
    a processor coupled to a bus; and
    a memory coupled to said bus and containing instructions that when executed implement a method for sorting integrated circuits, said method comprising:
    a) solving the relationship $\ln(t) = \alpha + Ea/(K^*T) + \beta^*margin + Y^*margin/T$;
    b) using the value of t from said relationship to predict data retention time of an oxide-nitride-oxide memory; and
    c) rejecting said oxide-nitride-oxide memory if said data retention time is below a threshold value.

21. The system as described in claim 20 wherein said Ea, said β and said Y are determined by comparing empirical data for change in threshold margin at multiple temperatures.

22. The method as described in claim 20 further comprising:
   d) programming said non-volatile memory;
   e) measuring threshold margin and field E required for said programming;
   f) baking said memory at a first temperature;
   g) measuring threshold margin after the completion of said f);
   h) baking said memory at a second temperature; and
   i) measuring threshold margin after the completion of said h).

23. The method as described in claim 20 wherein said first temperature is substantially similar to 100 degrees C.

24. The method as described in claim 20 wherein said second temperature is substantially similar to 300 degrees C.

25. The method as described in claim 20 further comprising:
   computing ($\sqrt{qE/\pi\epsilon_i}$) minus (Ea−Y*K*margin) to produce a difference; and
   accepting said data retention time as valid if said difference is less than substantially 20%.

26. A computer implemented method of predicting the data retention time of an oxide-nitride-oxide based non-volatile memory comprising:
   combining Frenkel-Poole emission with direct tunneling through a tunnel oxide to form a first relationship, said first relationship containing terms of a dynamic potential barrier;
   solving said first relationship for data retention time, wherein said dynamic potential barrier is set as a constant and wherein said solving produces a second relationship; and
   computing data retention time of an oxide-nitride-oxide based non-volatile memory using said second relationship.

* * * * *